(12) United States Patent
Shi et al.

(10) Patent No.: US 12,517,438 B2
(45) Date of Patent: Jan. 6, 2026

(54) INTEGRATED PROCESSING EQUIPMENT

(71) Applicant: Chengdu Soar Smart Technology Co., Ltd., Chengdu (CN)

(72) Inventors: Jiying Shi, Chengdu (CN); Borui Liu, Chengdu (CN); Wenmeng Guan, Chengdu (CN)

(73) Assignee: Chengdu Soar Smart Technology Co., Ltd., Chengdu (CN)

( * ) Notice: Subject to any disclaimer, the term of this patent is extended or adjusted under 35 U.S.C. 154(b) by 248 days.

(21) Appl. No.: 18/284,082

(22) PCT Filed: Jun. 13, 2023

(86) PCT No.: PCT/CN2023/099782
§ 371 (c)(1),
(2) Date: Sep. 26, 2023

(87) PCT Pub. No.: WO2023/202725
PCT Pub. Date: Oct. 26, 2023

(65) Prior Publication Data
US 2025/0085638 A1 Mar. 13, 2025

(30) Foreign Application Priority Data
Apr. 18, 2022 (CN) .......................... 202210406069.9

(51) Int. Cl.
*G03F 7/30* (2006.01)
(52) U.S. Cl.
CPC .......... *G03F 7/3021* (2013.01); *G03F 7/3092* (2013.01)
(58) Field of Classification Search
CPC ............................ G03F 7/3021; G03F 7/3092

USPC ......................................................... 134/155
See application file for complete search history.

(56) References Cited

FOREIGN PATENT DOCUMENTS

| CN | 114815528 A | 7/2002 |
|----|-------------|--------|
| CN | 104076622 A | 10/2014 |
| CN | 110308623 A | 10/2019 |
| CN | 110927912 A | 3/2020 |
| CN | 111781210 A | 10/2020 |

(Continued)

OTHER PUBLICATIONS

WO2007083358A1—machine translation (Year: 2007).*

(Continued)

*Primary Examiner* — Tinsae B Ayalew
(74) *Attorney, Agent, or Firm* — Laine IP Oy (57) ABSTRACT

Provided are integrated processing equipment, including base, rotating device, and flow-guide device. The rotating device includes inclination-angle adjusting unit and rotating unit. The inclination-angle adjusting unit is arranged on the base, the rotating unit is connected with the inclination-angle adjusting unit, the rotating unit is used to carry the workpiece and can drive the workpiece to rotate around first axis, and the inclination-angle adjusting unit is used to drive the rotating unit to rotate around second axis at angle to the first axis. The flow-guide device includes frame body, liquid storage part and flow-guide part. The frame body is connected to the inclination-angle adjusting unit, both the liquid storage part and the flow-guide part are connected to the frame body, and the liquid storage part is used to transport the liquid to the flow-guide part, through which the liquid can flow to the workpiece positioned on the rotating unit.

13 Claims, 5 Drawing Sheets

(56) References Cited

FOREIGN PATENT DOCUMENTS

| | | |
|---|---|---|
| CN | 213001464 U | 4/2021 |
| CN | 113671797 A | 11/2021 |
| CN | 215371962 U | 12/2021 |
| CN | 114102537 A | 3/2022 |
| JP | 2004095707 A | 3/2004 |
| JP | 2006229029 A | 8/2006 |
| KR | 20090092412 A | 9/2009 |
| WO | WO-2007083358 A1 * 7/2007 ....... H01L 21/67028 |

OTHER PUBLICATIONS

International Search Report & Written Opinion in PCT/CN2023/099782 dated Sep. 19, 2023.
Notification of Grant of Invention Patent Right in CN2022104060699 dated Mar. 31, 2025.
Search Report in CN2022104060699 dated Mar. 17, 2025.

\* cited by examiner

INTEGRATED PROCESSING EQUIPMENT

CROSS-REFERENCES TO RELATED APPLICATIONS

The present disclosure claims priority to Chinese Patent Application No. 202210406069.9 filed on Apr. 18, 2022 with the Chinese Patent Office, and entitled "Integrated Processing Equipment", the contents of which are incorporated herein by reference in entirety.

TECHNICAL FIELD

The present disclosure relates to the field of processing technology, in particular to an integrated processing equipment.

BACKGROUND ART

The development process, as an intermediate procedure in the photolithography process, aims at removing part of the photoresist on the wafer and forming a three-dimensional physical pattern, so as to accurately copy the circuit structure on the mask plate to the photoresist layer of the silicon wafer. During the development process, an acid-base neutralization reaction occurs between the fluid and the photoresist in the exposed area, and the residue in the reaction needs to be removed by deionized water after development. The key point of development is to ensure that the feature size (the minimum line width of semiconductor devices in the manufacturing of integrated circuit) meets the requirements. When the feature size meets the requirements, it is considered that all geometric features produced during processing meet the requirements. There are three traditional development processes, including immersion development, continuous spray development and rotary immersion development. As for the continuous spray development in the prior art, the fluid is sprayed onto the wafer in the form of mist, and the wafer is rotated at a speed of 100 r/min-500 r/min at the same time.

The inventors have found through research that the existing development equipment has the following disadvantages:

poor applicability and high cost.

SUMMARY

The purpose of the present disclosure is to provide an integrated processing equipment, which can process workpieces of different sizes, and has strong adaptability, wide application range, and low cost.

The embodiment of the present disclosure is realized as follows.

The present disclosure provides an integrated processing equipment, including:
a base;
a rotating device, wherein the rotating device includes an inclination-angle adjusting unit and a rotating unit, wherein the inclination-angle adjusting unit is arranged on the base; the rotating unit is connected with the inclination-angle adjusting unit; the rotating unit is configured to carry the workpiece and can drive the workpiece to rotate around the first axis; and the inclination-angle adjusting unit is configured to drive the rotating unit to rotate around the second axis at an angle with the first axis; and a flow-guide device, wherein the flow-guide device includes a frame body, a liquid storage part and a flow-guide part, wherein the frame body is connected with the inclination-angle adjusting unit; the liquid storage part and the flow-guide part are both connected to the frame body; the liquid storage part is configured to transport liquid to the flow-guide part; and the liquid can flow to the workpiece positioned on the rotating unit through the flow-guide part.

In an optional embodiment, the inclination-angle adjusting unit includes a first driver and a mounting platform, wherein the first driver is connected to the base; the mounting platform is connected to the first driver; and the first driver is configured to drive the mounting platform to rotate around the first axis; and both the rotating unit and the frame body are connected to the mounting platform.

In an optional embodiment, the mounting platform is provided with a liquid collecting tank and a liquid discharge port communicated with the liquid collecting tank; the base is provided with a liquid collecting chamber; the liquid discharge port is communicated with the liquid collecting chamber; the rotating unit is arranged in the liquid collecting tank; the liquid collecting tank is configured to collect the liquid falling from the workpiece; and the liquid can enter the liquid collecting chamber from the liquid discharge port.

In an optional embodiment, the rotating unit includes a second driver, a rotating tray, and a positioning assembly, wherein the second driver is connected to the mounting platform; the rotating tray is connected to the second driver; the second driver is configured to drive the rotating tray to rotate around the second axis; the positioning assembly is connected to the rotating tray; and the positioning assembly is configured to position the workpiece located on the rotating tray.

In an optional embodiment, the positioning assembly includes a plurality of clamping blocks, wherein the plurality of clamping blocks are all connected to the rotating tray, and the plurality of clamping blocks jointly define a clamping region for clamping the workpiece, and at least one of the plurality of clamping blocks can move relatively to the rotating tray to adjust the size of the clamping region.

In an optional embodiment, the flow-guide part is provided with a liquid outlet side, wherein the flow-guide part is movably connected with the frame body for adjusting the distance between the liquid outlet side and the frame body, thereby adjusting the distance between the liquid outlet side and the workpiece positioned on the rotating unit.

In an optional embodiment, the flow-guide part is slidably connected to the frame body in the extension direction of the second axis, so as to adjust the distance between the liquid outlet side and the frame body.

In an optional embodiment, the flow-guide device further includes a locking unit, wherein the locking unit is connected both to the flow-guide part and the frame body, and the locking unit has a locked state and an unlocked state that are switchable, wherein when in the locked state, the flow-guide part is relatively fixed to the frame body in the extension direction of the second axis; and when in the unlocked state, the flow-guide part can slide relatively to the frame body in the extension direction of the second axis.

In an optional embodiment, the liquid storage part is slidably connected with the frame body in the extension direction of the second axis, so as to adjust the distance between the liquid storage part and the flow-guide part.

In an optional embodiment, the liquid storage part is provided with a first chamber and a second chamber that are independent of each other, wherein the first chamber is provided with a first outlet, and the first chamber is configured to store fluid; and the second chamber is provided with a second outlet, and the second chamber is configured to store cleaning solution.

The beneficial effect of the embodiment of the present disclosure is as follow.

To sum up, the integrated processing equipment provided by this embodiment can be applied to the development application. Specifically, when performing development processing on the workpiece, the workpiece is positioned on the rotating unit, and then the inclination angle (dip angle) of the workpiece relative to the horizontal plane is adjusted through the inclination-angle adjusting unit according to the thickness of the workpiece, that is, the inclination angle of the workpiece relative to the flow-guide part is adjusted, such that the fluid flowing from the flow-guide part to the surface of the workpiece has a small impact force on the surface of the workpiece, which has less chance of damaging the surface of the workpiece, and leads to a high development quality. According to the different thicknesses of workpieces, the angle between the workpiece and the flow-guide part can be adjusted as required. In this way, it can adapt to the developing operation for workpieces of different sizes and can ensure the development quality, which has a wide application range. Moreover, no specialized developing equipment is needed to be designed for workpieces of different sizes, thereby reducing costs.

BRIEF DESCRIPTION OF DRAWINGS

In order to more clearly illustrate the technical solutions of the embodiments of the present disclosure, the drawings that are required in the embodiments will be briefly introduced below. It should be understood that the following drawings only show some embodiments of the present disclosure, and thus should not be regarded as a limitation on the scope, and those ordinarily skilled in the art can also obtain other related drawings based on these drawings without inventive effort.

REFERENCE NUMERALS

001—first axis; 002—second axis; 100—base; 110—liquid collecting chamber; 120—water pump; 130—mounting block; 200—rotating device; 210—inclination-angle adjusting unit; 211—first driver; 212—mounting platform; 2121—base body; 2122—plate body; 2123—liquid collecting tank; 2124—liquid discharge port; 220—rotating unit; 221—second driver; 222—rotating tray; 223—positioning assembly; 300—flow-guide device; 310—frame body; 311—fixing plate; 312—fixing rod; 313—adjusting rod; 320—liquid storage part; 321—first outlet; 322—second outlet; 330—flow-guide part; 331—liquid outlet side; 332—snapping hole; 3321—first hole section; 3322—second hole section; 340—locking unit; 341—snapping rod; 342—annular protrusion.

DETAILED DESCRIPTION OF EMBODIMENTS

In order to make the purposes, technical solutions and advantages of the embodiments of the present disclosure clearer, the technical solutions in the embodiments of the present disclosure will be clearly and completely described below in conjunction with the drawings in the embodiments of the present disclosure. Obviously, the described embodiments are some of the embodiments of the present disclosure, not all of them. The components of the embodiments of the present disclosure generally described and illustrated in the drawings herein can be arranged and designed in a variety of different configurations.

Accordingly, the following detailed description of the embodiments of the present disclosure provided in the drawings is not intended to limit the scope of the claimed disclosure, but merely represents selected embodiments of the present disclosure. Based on the embodiments in the present disclosure, all other embodiments obtained by persons of ordinary skill in the art without inventive efforts fall within the protection scope of the present disclosure.

It should be noted that similar numerals and letters denote similar items in the drawings below, and therefore, once an item is defined in one drawing, no further definition or explanation is required in subsequent drawings.

In the description of the present disclosure, it should be noted that the terms "center", "up", "low", "left", "right", "vertical", "horizontal", "inner", "outer", etc. indicate orientation or positional relationship based on the orientation or positional relationship shown in the drawings, or the orientation or positional relationship that is usually placed when the product of the present disclosure is used. Those are only for the convenience of describing the present disclosure and simplifying the description, rather than indicating or implying the devices or elements referred to must be in a particular orientation, or be constructed and operated in a particular orientation, and therefore, should not be construed as limiting the present disclosure. In addition, the terms "first", "second", "third", etc. are only used for distinguishing descriptions, and should not be construed as indicating or implying relative importance.

Furthermore, the terms "horizontal", "vertical" and the like do not imply that a component is absolutely horizontal or overhanging, but can be slightly inclined. For example, "horizontal" only means that its direction is more horizontal than "vertical", and it does not mean that the structure must be completely horizontal, but can be slightly inclined.

In the description of the present disclosure, it should also be noted that, unless otherwise clearly specified and limited, the terms "configure", "install", "connect" and "communicate" should be understood in a broad sense. For example, the connection can be a fixed connection, can also be detachable connection, or integral connection; it can be mechanical connection, can also be electrical connection;

and it can be direct connection, can also be indirect connection through an intermediary, and also can be internal communication between two components. Those of ordinary skill in the art can understand the specific meanings of the above terms in the present disclosure in specific situations.

At present, in the field of semiconductor processing, when a workpiece is subjected to the development process, the workpiece is generally positioned on a rotating tray, then the fluid is guided to the surface of the workpiece, and the workpiece is continuously rotated to achieve development in the entire circumferential direction. After the workpiece and the rotating tray are positioned, since the angle of the rotating tray is fixed, the angle of the workpiece relative to the horizontal plane is fixed and cannot be adjusted. When the size of the workpiece is different, the height between the workpiece and the outlet side of the fluid will change. When the fluid reaches the surface of the workpiece, the impact force will change, and the impact force is likely to damage the workpiece, thereby reducing the yield of finished products.

Combining FIG. 1-FIG. 8, in view of this, the designer designed an integrated processing equipment, which can be applied in the development field, and can adjust the inclination angle of the workpiece relative to the horizontal plane as required, thereby adjusting the distance between the fluid and the surface of the workpiece, and reducing the impact force; and can also adjust the flow rate of the developing solution on the surface of the workpiece, so as to facilitate the control for the development quality, and improve the yield of finished products.

Figure 1:
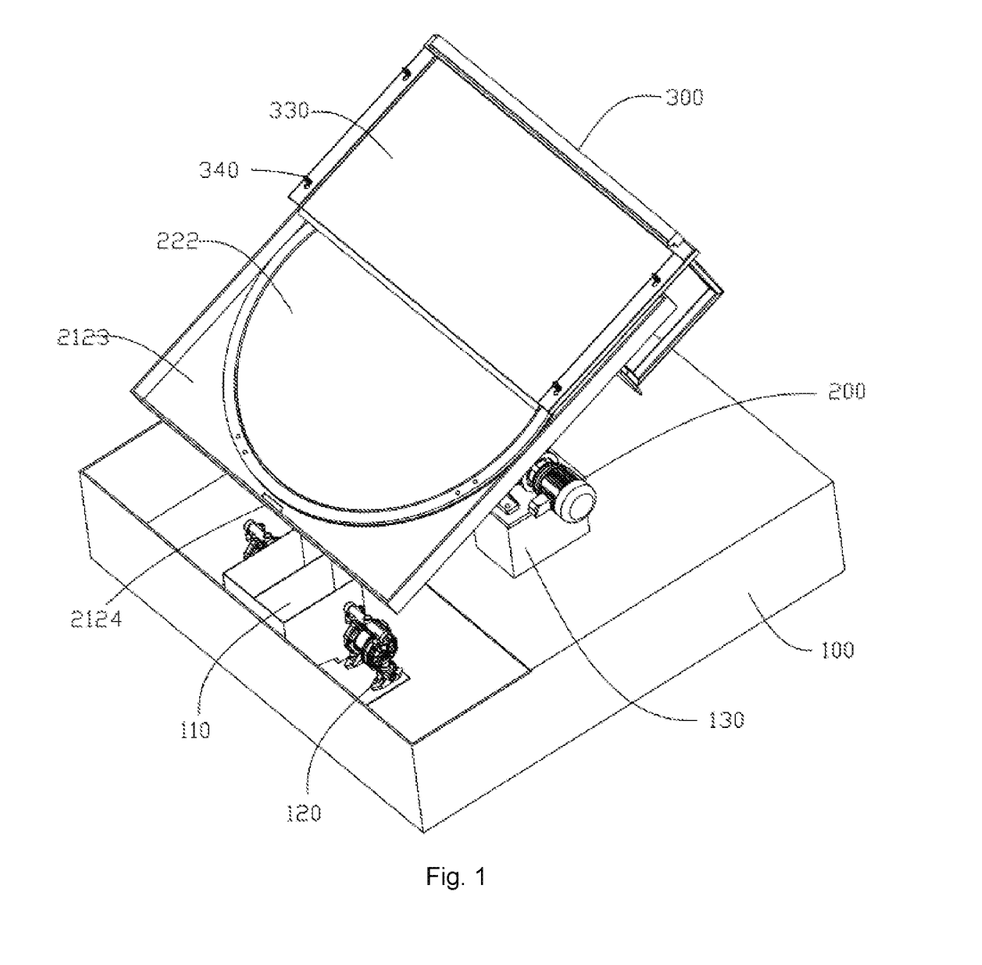
FIG. 1 is a structural schematic view of an integrated processing equipment of an embodiment of the present disclosure in an angle of view.
Figure 2:
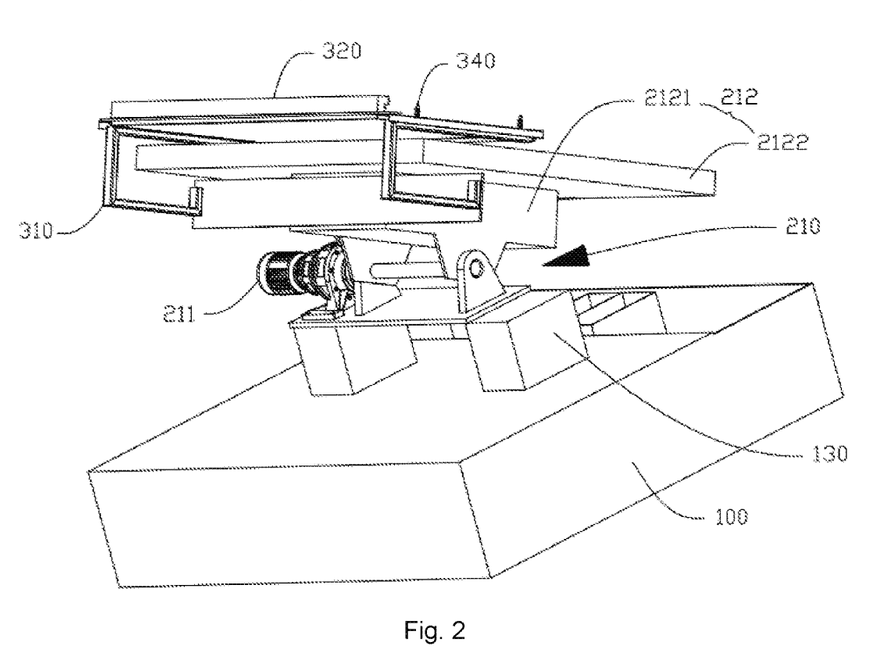
FIG. 2 is a structural schematic view of the integrated processing equipment of the embodiment of the present disclosure in another angle of view.
Figure 3:
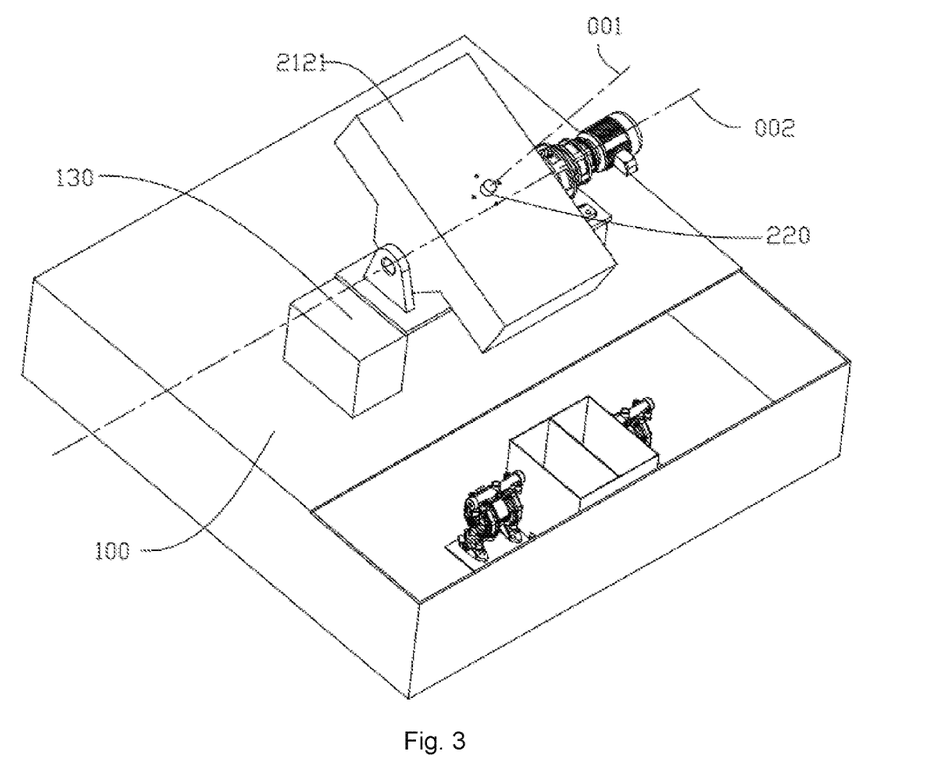
FIG. 3 is a partially structural schematic view of the integrated processing equipment of the embodiment of the present disclosure.

Referring to FIG. 1-FIG. 3, in this embodiment, the integrated processing equipment includes a base 100, a rotating device 200 and a flow-guide device 300. Base 100 is fixed on a supporting surface, wherein the supporting surface can be a workbench or the ground. Rotating device 200 include an inclination-angle adjusting unit 210 and the rotating unit 220, the inclination-angle adjusting unit 210 is provided on base 100, and the rotating unit 220 and the inclination-angle adjusting unit 210 are connected. The rotating unit 220 is configured to carry the workpiece and drive the workpiece to rotate around the first axis 001; and the inclination-angle adjusting unit 210 is configured to drive the rotating unit 220 to rotate around the second axis 002 at an angle with the first axis 001. The flow-guide device 300 includes a frame body 310, a liquid storage part 320 and a flow-guide part 330. The frame body 310 and the inclination-angle adjusting unit 210 are connected, and the liquid storage part 320 and the flow-guide part 330 are both connected to the frame body 310. The liquid storage part 320 is configured to transport liquid to the flow-guide part 330, and the liquid can flow to the workpiece positioned on the rotating unit 220 through the flow-guide part 330.

It should be noted that, in this embodiment, the first axis 001 is perpendicular to the second axis 002, and the second axis 002 substantially coincides with the horizontal plane. Obviously, in other embodiments, the degree of angle between the first axis 001 and the second axis 002 also can be of other degrees rather than 0° and 90°. Meanwhile, the second axis 002 can have a non-zero included angle with the horizontal plane.

In this embodiment, optionally, the base 100 is configured as a square table, wherein the base 100 is provided with a first board and a second board that are opposite to each other. The first board is used for being fixed on the supporting surface, and the second board faces upwards. Two mounting blocks 130 are arranged on the second board, wherein these two mounting blocks 130 are all square blocks, and these two mounting blocks 130 are arranged at intervals. Each mounting block 130 is provided with a bearing hole, and two bearing holes on two mounting blocks 130 are arranged coaxially. Further, the base 100 is provided with a liquid collecting chamber 110, wherein the liquid collecting chamber 110 is provided with an opening located on the second board, and a water pump 120 is arranged in the liquid collecting chamber 110.

Referring to FIG. 2, in this embodiment, optionally, the inclination-angle adjusting unit 210 includes a first driver 211, a mounting platform 212 and bearings (not shown in drawings). The first driver 211 is configured as a motor, and the first driver 211 is fixed on the second board. Two bearings are provided, and these two bearings are respectively embedded in the bearing holes of two mounting blocks 130. The output shaft of the first driver 211 penetrates through the inner rings of the two bearings at the same time, so that the output shaft of the first driver 211, via two bearings, is rotatably connected with two mounting blocks 130 around the second axis 002. The mounting platform 212 is fixed on the output shaft of the first driver 211, and can rotate along with the output shaft. That is to say, after the mounting platform 212 is installed on the output shaft, the mounting platform 212 and the output shaft are relatively fixed in the circumferential direction of the output shaft. For example, mounting platform 212 can be fixedly connected to the output shaft via splines or pin shafts. Further, the mounting platform 212 includes a base body 2121 and a plate body 2122 which are connected to each other, and the base body 2121 is sleeved outside the output shaft and fixedly connected with the output shaft. The plate body 2122 is provided with a liquid collecting tank 2123 and a liquid discharge port 2124 communicating with the liquid collecting tank 2123, the middle part of the liquid collecting tank 2123 is provided with a through hole, which is a cylindrical hole, wherein a sealed bearing is arranged in the through hole. The liquid in the liquid collecting tank 2123 can be discharged into the liquid collecting chamber 110 through the liquid discharge port 2124.

In other embodiments, optionally, the inclination-angle adjusting unit 210 also includes an angle measurer, wherein the angle measurer is connected with the first driver 211 for detecting the rotation angle of the output shaft of the first driver 211, so as to obtain the angle of rotation of the mounting platform 212 and then obtain the angle of the mounting platform 212 relative to the horizontal plane, and finally the angle of the workpiece relative to the horizontal plane can be obtained.

Figure 4:
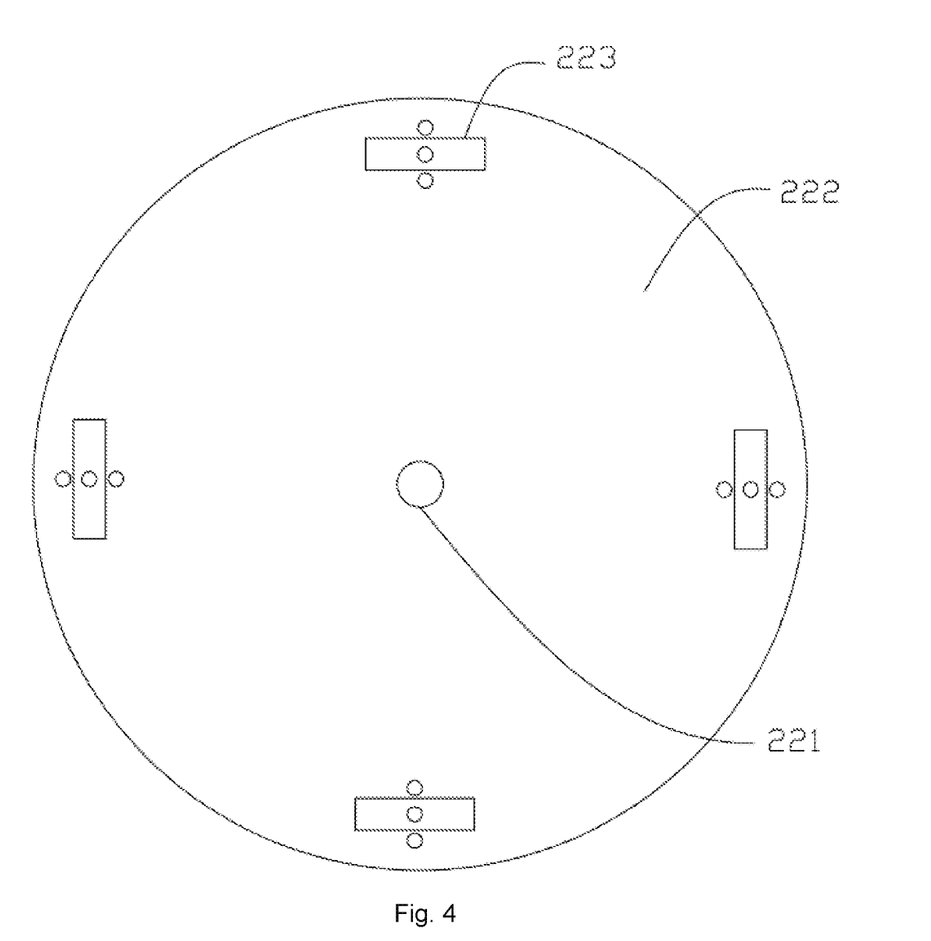
FIG. 4 is a structural schematic view of a rotating tray and a positioning assembly of an embodiment of the present disclosure.

Referring to FIG. 1 and FIG. 4, in this embodiment, optionally, the rotating unit 220 includes a second driver 221, a rotating tray 222 and a positioning assembly 223. The second driver 221 is configured as a motor. The second driver 221 is fixed to the base body 2121, and the output shaft of the second driver 221 passes through the sealed bearing, and the output shaft of the second driver 221 extends into the liquid collecting tank 2123. The rotating tray 222 can be a disc, wherein the rotating tray 222 is located in liquid collecting tank 2123, the rotating tray 222 and the output shaft are in fixed connection, and the axis of rotating tray 222 is collinear with the axis of the output shaft. The positioning assembly 223 is arranged on the rotating tray 222, and the positioning assembly 223 is configured to position the workpiece on the rotating tray 222, so that the workpiece will not move relatively to the rotating tray 222 during the development process.

Optionally, positioning assembly 223 includes a plurality of positioning blocks, wherein the plurality of positioning blocks are all connected with the rotating tray 222, and at least one of the plurality of positioning blocks can slide along the radial direction of the rotating tray 222 relatively to the rotating tray 222, so as to adjust the position of the positioning blocks relative to the rotating tray 222. It should be understood that the plurality of positioning blocks are configured to cooperate with each other to clamp the workpiece, and the plurality of positioning blocks jointly form a clamping region. When the positioning blocks move relatively to the rotating tray 222, the size of the clamping region changes, such that it can adapt to clamp different workpieces, which has a wide application range and low costs.

It should be noted that each of the plurality of positioning blocks can be configured to be able to slide relatively to the rotating tray 222, such that the adjustment range is wider, the adjustment is more flexible, and there are more types of workpieces that can be clamped. Obviously, in other embodiments, only one positioning block among the plurality of positioning blocks can be configured to be able to move relatively to the rotating tray 222, and the function of adjusting the size of the clamping area can also be realized.

In addition, the positioning blocks can be fixed on the rotating tray 222 by screws, and a plurality of threaded holes can be arranged on the rotating tray. When the screws are screwed in different threaded holes, the position of the positioning blocks relative to the rotating tray 222 in the radial direction of the rotating tray 222 can be changed, such that the size of the clamping region can keep constant after adjusting the size of the clamping region, so as to stably clamp the workpiece.

Figure 5:
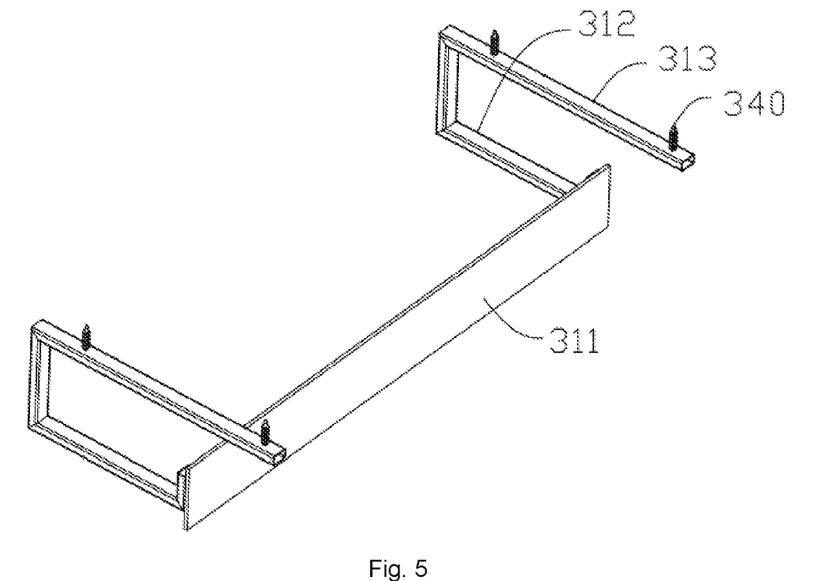
FIG. 5 is a structural schematic view of the frame body and the locking unit of the embodiment of the present disclosure.

Referring to FIG. 5, in this embodiment, optionally, the frame body 310 includes fixing plate 311, fixing rod 312 and adjusting rod 313. The fixing plate 311 is configured as a rectangular plate, and the fixing plate 311 is fixed to the base body 2121 via screws. One end of the fixing rod 312 is connected to the fixing plate 311, and the other end is connected with the adjusting rod 313. The number of fixing rod 312 and the number of adjusting rod 313 are two respectively, the first ends of the two fixing rods 312 are connected with the base body 2121, and the other ends of the two fixing rods 312 are fixedly connected with two adjusting rods 313 respectively. The two adjusting rods 313 are both perpendicular to the second axis 002 and are arranged at intervals in the extension direction of the second axis 002.

Further, each adjusting rod 313 is slidably connected with the corresponding fixing rod 312, and the sliding direction of the adjusting rod 313 relative to the fixing rod 312 is parallel to the guiding direction where liquid is driven by the flow-guide part 330 to flow to the workpiece. In this way, when the size of the workpiece positioned on the rotating tray 222 is small, by adjusting the position of the adjusting rod 313 relative to the fixing rod 312, the flow-guide part 330 is made to be close to or far away from the workpiece, such that the liquid flowing from the flow-guide part 330 can drop onto the workpiece smoothly.

In this embodiment, optionally, the flow-guide part 330 cooperates slidably with the frame body 310 through the locking unit 340, wherein the locking unit 340 has a locked state and an unlocked state that can be switched to each other. When in the locked state, the flow-guide part 330 and the frame body 310 are relatively fixed in the extension direction of the second axis 002. When in the unlocked state, the flow-guide part 330 can slide in the extension direction of the second axis 002 relatively to the frame body 310. In this way, the flow-guide part 330 can move relatively to the frame body 310 and then move relatively to the rotating tray 222, thereby realizing the adjustment for the distance between the flow-guide part 330 and the rotating tray 222. Finally, the adjustment for the distance between the flow-guide part 330 and the surface of the workpiece on the rotating tray 222 is realized. Such design enables the adjustment for the position of the flow-guide part 330 according to the different thicknesses of workpieces, such that the distance between the flow-guide part 330 and the workpiece remains in a reasonable distance range, and the liquid guided by the flow-guide part 330 and flowing through the liquid outlet side 331 of the flow-guide part 330 to the surface of the workpiece can evenly cover the surface of the workpiece, thereby improving the quality of process.

Figure 6:
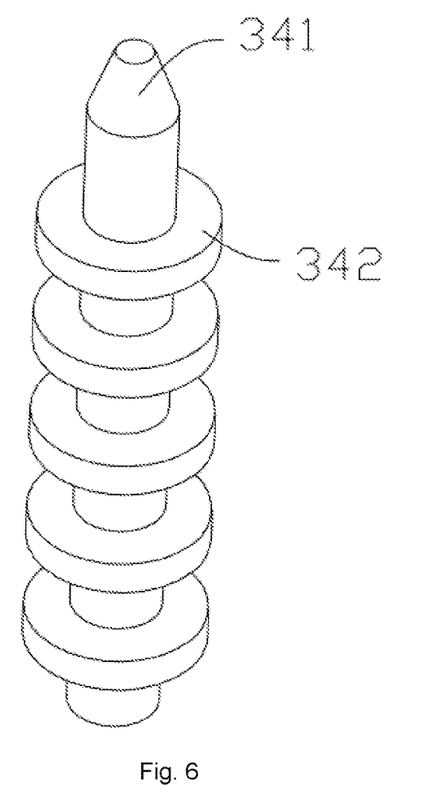
FIG. 6 is a structural schematic view of a locking unit of an embodiment of the present disclosure.

Referring to FIG. 6, optionally, the locking unit 340 includes a plurality of snapping rods 341, wherein each adjusting rod 313 is provided with at least one snapping rod 341, and each snapping rod 341 is provided with annular protrusions 342 evenly arranged at intervals in the extension direction of the axis of the snapping rod 341. The snapping rod 341 is perpendicular to the adjusting rod 313. There may be one, two, three, etc. snapping rods 341 provided on each adjusting rod 313.

Figure 7:
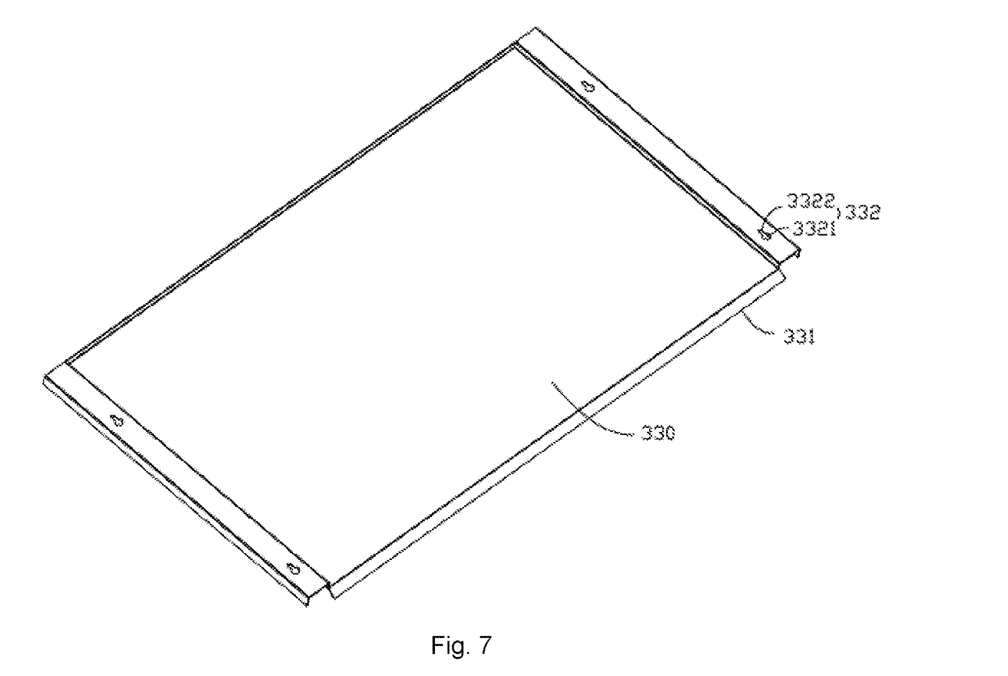
FIG. 7 is a structural schematic view of a flow-guide part of an embodiment of the present disclosure.

Referring to FIG. 7, optionally, the flow-guide part 330 is configured as a square plate, wherein one side of the flow-guide part 330 is configured as the liquid outlet side 331. The flow-guide part 330 is provided with snapping holes 332 penetrating through the flow-guide part 330 in its thickness direction, wherein the snapping hole 332 includes first hole section 3321 and the second hole section 3322 that are communicated with each other. The first hole section 3321 and the second hole section 3322 both are arc hole sections, and the aperture of the first hole section 3321 is larger than the aperture of the second hole section 3322. The number of the snapping holes 332 on the flow-guide part 330 is determined according to the number of snapping rods 341, wherein the number of snapping holes 332 is equal to the number of snapping rods 341 and the snapping holes 332 are in one-to-one correspondence to the snapping rods 341. Each snapping rod 341 is able to be inserted into one corresponding snapping hole 332. In addition, the snapping rod 341 can move between the first hole section 3321 and the second hole section 3322. When the snapping rod 341 is in the first hole section 3321, the locking unit 340 is in the unlocked state, and the snapping rod 341 can move in the extension direction of the axis of the first hole section 3321 relatively to the flow-guide part 330, thereby adjusting the position of the flow-guide part 330. Moreover, after moving to the desired position, the snapping rod 341 is slid into the second hole section 3322, and then the annular protrusions 342 are snapped to the flow-guide part 330. At this time, the locking unit 340 is in the locked state, such that the flow-guide part 330 and the snapping rod 341 remain fixed in the extension direction of the axis of the snapping rod 341. Therefore, the adjustment operation for the position of the flow-guide part 330 relative to the frame body 310 is convenient and flexible.

Obviously, in other embodiments, the flow-guide part 330 can also be configured to be rotatable relatively to the frame body 310, which can also achieve adjustment for the distance between the liquid outlet side 331 and the workpiece.

Figure 8:
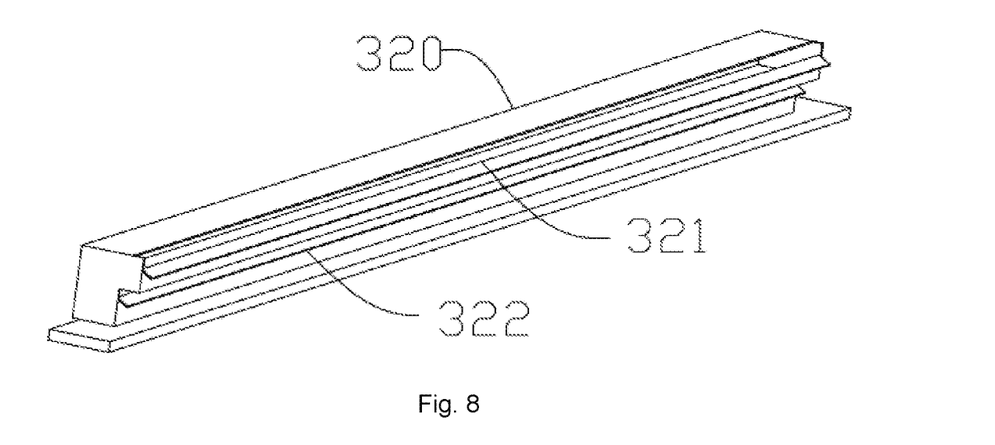
FIG. 8 is a structural schematic view of a liquid storage part of an embodiment of the present disclosure.

Referring to FIG. 8, in this embodiment, optionally, the liquid storage part 320 is provided with a first chamber and a second chamber that are independent of each other. The first chamber has a first outlet 321 and a first inlet. The first chamber is used to store fluid, and the fluid can be a developing solution, etc. The second chamber has a second outlet 322 and a second inlet, and the second chamber is configured to store cleaning solution. In practice, when it is necessary to perform development, the first chamber is replenished with fluid through the first inlet, and the fluid is discharged from the first outlet 321 and falls onto the flow-guide part 330, and then flows from the liquid outlet side 331 of the flow-guide part 330 to the surface of the workpiece. After the development is completed and the workpiece needs to be cleaned, the cleaning solution in the second chamber is discharged from the second outlet 322, and consequently, flows to the surface of workpiece through the flow-guide part 330.

Further, both the first outlet 321 and the second outlet 322 are strip-shaped, and the first outlet 321 and the second outlet 322 both extend along the extension direction of the second axis 002. In this way, the liquid can flow out of the first outlet 321 and the second outlet 322 in the shape of a water curtain, thereby flowing toward the flow-guide part 330 more equably.

In this embodiment, the integrated processing equipment includes, for example, the following working method.

The workpiece is placed on the rotating tray 222, and clamped on the rotating tray 222 by moving the positioning blocks. Then, the inclination-angle adjusting unit 210 is adjusted to drive the mounting platform 212 to rotate, and then drive the rotating tray 222, the workpiece, the rotating unit 220 and the flow-guide device 300 to change the inclination angle with respect to the horizontal plane at the same time. After the adjustment for the inclination angle is completed, the height of the flow-guide plate relative to the workpiece is adjusted, and then the operations of development and cleaning are carried out. Obviously, in other steps, it is feasible to adjust the distance between the flow-guide plate and the workpiece first, and then adjust the inclination angle of the workpiece.

The integrated processing equipment provided in this embodiment can process workpieces of different shapes and sizes, wherein the size of the workpiece includes the size of outer contour and the thickness of the workpiece, and the shape of the workpiece can be round, square, and so on, such that it has a wider range of processing and a wider range of use, and low cost. At the same time, the inclination angle and distance of the workpiece relative to the flow-guide plate can be adjusted according to the requirements on the workpiece, thereby satisfying processing with multiple requirements and making the processing quality higher.

It should be noted that the integrated processing equipment can also be applied to other operating scenarios, for example, applied to acid coating, film coating, or other operating scenarios.

The above descriptions are only preferred embodiments of the present disclosure and are not intended to limit the present disclosure. For those of ordinary skill in the art, various modifications and changes can be made in the present disclosure. Any modifications, equivalent replacements, improvements, etc. made within the spirit and principles of the present disclosure shall be included within the protection scope of the present disclosure.

What is claimed is:

1. An integrated processing equipment, comprising:
   a base;
   a rotating device, wherein the rotating device comprises an inclination-angle adjusting unit and a rotating unit, wherein the inclination-angle adjusting unit is arranged on the base; the rotating unit is connected with the inclination-angle adjusting unit; the rotating unit is configured to carry a workpiece and can drive the workpiece to rotate around a first axis; and the inclination-angle adjusting unit is configured to drive the rotating unit to rotate around a second axis at an angle with the first axis; and
   a flow-guide device, wherein the flow-guide device comprises a frame body, a liquid storage part and a flow-guide part, wherein the frame body is connected with the inclination-angle adjusting unit; the liquid storage part and the flow-guide part are both connected to the frame body; the liquid storage part is configured to transport a liquid to the flow-guide part; and the liquid can flow to the workpiece positioned on the rotating unit through the flow-guide part, wherein
   the inclination-angle adjusting unit comprises a first driver and a mounting platform, wherein the first driver is connected to the base, the mounting platform is connected to the first driver, and the first driver is configured to drive the mounting platform to rotate around the first axis; and
   both the rotating unit and the frame body are connected to the mounting platform.

2. The integrated processing equipment according to claim 1, wherein
   the mounting platform is provided with a liquid collecting tank and a liquid discharge port communicating with the liquid collecting tank; and the base is provided with a liquid collecting chamber, wherein the liquid discharge port is communicated with the liquid collecting chamber; the rotating unit is provided in the liquid collecting tank; and the liquid collecting tank is configured to collect a liquid dropping from the workpiece, and the liquid can enter the liquid collecting chamber through the liquid discharge port.

3. The integrated processing equipment according to claim 1, wherein
   the rotating unit comprises a second driver, a rotating tray, and a positioning assembly, wherein the second driver is connected to the mounting platform; the rotating tray is connected to the second driver; the second driver is configured to drive the rotating tray to rotate around the second axis; the positioning assembly is connected with the rotating tray; and the positioning assembly is configured to position the workpiece located on the rotating tray.

4. The integrated processing equipment according to claim 3, wherein
   the positioning assembly comprises a plurality of clamping blocks, wherein the plurality of clamping blocks are all connected to the rotating tray; the plurality of clamping blocks jointly define a clamping region for clamping the workpiece; at least one of the plurality of clamping blocks can move relatively to the rotating tray, so as to adjust a size of the clamping region.

5. The integrated processing equipment according to claim 1, wherein
   the flow-guide part is provided with a liquid outlet side, wherein the flow-guide part is movably connected with the frame body, and is configured to adjust a distance between the liquid outlet side and the frame body, so as to adjust a distance between the liquid outlet side and the workpiece positioned on the rotating unit.

6. The integrated processing equipment according to claim 5, wherein
   the flow-guide part is slidably connected with the frame body in an extension direction of the second axis, so as to adjust the distance between the liquid outlet side and the frame body.

7. The integrated processing equipment according to claim 6, wherein the flow-guide device further comprises a locking unit, wherein the locking unit is connected to both the flow-guide part and the frame body, and the locking unit has a locked state and an unlocked state that can be switched between each other, wherein when in the locked state, the flow-guide part and the frame body are relatively fixed in the extension direction of the second axis; and when in the unlocked state, the flow-guide part can slide relatively to the frame body in the extension direction of the second axis.

8. The integrated processing equipment according to claim 5, wherein the liquid storage part is slidably connected with the frame body in an extension direction of the second axis, so as to adjust a distance between the liquid storage part and the flow-guide part.

9. The integrated processing equipment according to claim 8, wherein the liquid storage part is provided with a first chamber and a second chamber that are independent of each other, wherein the first chamber has a first outlet, and the first chamber is configured to store a fluid; and the second chamber has a second outlet, and the second chamber is configured to store a cleaning solution.

10. The integrated processing equipment according to claim 1, wherein the flow-guide part is provided with a liquid outlet side, wherein the flow-guide part is movably connected with the frame body, and is configured to adjust a distance between the liquid outlet side and the frame body, so as to adjust a distance between the liquid outlet side and the workpiece positioned on the rotating unit.

11. The integrated processing equipment according to claim 2, wherein the flow-guide part is provided with a liquid outlet side, wherein the flow-guide part is movably connected with the frame body, and is configured to adjust a distance between the liquid outlet side and the frame body, so as to adjust a distance between the liquid outlet side and the workpiece positioned on the rotating unit.

12. The integrated processing equipment according to claim 3, wherein the flow-guide part is provided with a liquid outlet side, wherein the flow-guide part is movably connected with the frame body, and is configured to adjust a distance between the liquid outlet side and the frame body, so as to adjust a distance between the liquid outlet side and the workpiece positioned on the rotating unit.

13. The integrated processing equipment according to claim 4, wherein the flow-guide part is provided with a liquid outlet side, wherein the flow-guide part is movably connected with the frame body, and is configured to adjust a distance between the liquid outlet side and the frame body, so as to adjust a distance between the liquid outlet side and the workpiece positioned on the rotating unit.

* * * * *